US006904573B1

(12) United States Patent
Burden (10) Patent No.: US 6,904,573 B1
(45) Date of Patent: Jun. 7, 2005

(54) LOGIC GATE IDENTIFICATION BASED ON HARDWARE DESCRIPTION LANGUAGE CIRCUIT SPECIFICATION

(75) Inventor: David Burden, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 196 days.

(21) Appl. No.: 10/446,097

(22) Filed: May 27, 2003

(51) Int. Cl.$^7$ ............................................. G06F 17/50
(52) U.S. Cl. .............................................. 716/2; 716/6
(58) Field of Search ........................................ 716/2, 6

(56) References Cited

U.S. PATENT DOCUMENTS

| | | | |
|---|---|---|---|
| 5,726,902 A | 3/1998 | Mahmood et al. | |
| 5,930,147 A | 7/1999 | Takei | |
| 6,169,968 B1 | 1/2001 | Kabuo | |
| 6,205,570 B1 | 3/2001 | Yamashita | |
| 6,324,679 B1 | 11/2001 | Raghunathan et al. | |
| 6,438,739 B1 * | 8/2002 | Yamada | 716/18 |
| 6,839,800 B2 * | 1/2005 | Stark | 711/108 |
| 2004/0103134 A1 * | 5/2004 | Cookman et al. | 708/620 |
| 2005/0005184 A1 * | 1/2005 | Lindt | 713/500 |

FOREIGN PATENT DOCUMENTS

| | | |
|---|---|---|
| JP | 07028877 A2 | 1/1993 |
| JP | 05135128 A2 | 6/1993 |
| JP | 05342295 A2 | 12/1993 |
| JP | 08272847 A2 | 10/1995 |
| JP | 10134093 A2 | 5/1998 |
| JP | 10187783 A2 | 7/1998 |
| JP | 11163694 A2 | 6/1999 |

OTHER PUBLICATIONS

Synopsys, PathMill Plus IP Core Characterization and Static Timing Verification, http://www.synopsys.com/products/analysis/pathmillplus_ds.pdf, 4.

Synopsys, PathMill: Transistor–Level Static Timing Analysis, http://www.synopsys.com/products/analysis/pathmill_ds.pdf, 2.

Synopsys, PrimeTime, http://www.synopsys.com/products/analysis/primetime_ds.html, 7.

Virtuoso Schematic Composer, cadence, http://www.cadence.com/datasheets/dat_pdf/2939b_virtuosob_DSfn-1.pdf, 4.

* cited by examiner

*Primary Examiner*—Stacy A. Whitmore
*Assistant Examiner*—Magid Y. Dimyan (57) ABSTRACT

Techniques are disclosed for estimating the signal propagation delays within a circuit, based on a description of the circuit written in a hardware description language (HDL), such as a register transfer language (RTL). Assignment statements in the description which describe the performance of a logical function are modeled using logic gates which perform the function described. A particular function may be modeled using one or more logic gates depending on the number of inputs to the function. The delay associated with performance of the function is estimated by estimating the delay through the circuit used to model the function. Estimates for multiple functions may be combined to estimate the total delay associated with a particular signal path through a circuit.

42 Claims, 7 Drawing Sheets

LOGIC GATE IDENTIFICATION BASED ON HARDWARE DESCRIPTION LANGUAGE CIRCUIT SPECIFICATION

BACKGROUND

1. Field of the Invention

The present invention relates to circuit design and, more particularly, to techniques for performing timing estimation in circuits specified using hardware description languages.

2. Related Art

Integrated circuits (ICs) are becoming increasingly large and complex, typically including millions of individual circuit elements, such as various kinds of passive elements and logic gates. Very Large Scale Integrated (VLSI) Circuits are too large and complex for a circuit designer, or even a large team of circuit designers, to manage effectively on an element-by-element basis. As a result of this increased size and complexity, IC designers are increasingly using electronic design automation (EDA) software tools to assist with IC design. Such tools help to manage the complexity of the design task in a variety of ways, such as by allowing ICs to be designed hierarchically, thereby enabling the design to be divided into modules and enabling the design task to be divided among multiple designers in a manner that limits the complexity faced by any one designer.

Various hardware description languages (HDLs) have been developed which allow circuit designs to be described at various levels of abstraction. A description of a circuit according to an HDL (referred to herein as a "model" or "specification" of the circuit) may, for example, describe a particular circuit design in terms of the logic gates in a digital system. Descriptions of a circuit at different levels of abstraction may be used for different purposes at various stages in the design process.

For example, one of the first steps in designing a modern microprocessor is to describe the functions performed by the processor using statements written in a Register Transfer Language (RTL), which is an example of an HDL. In general, an RTL is a language for describing the behavior of computers in terms of step-wise register contents. RTL statements resemble statements in computer programming languages, such as FORTRAN, PASCAL, and C. Variables in RTL statements correspond to wires and/or hardware registers, and operations in RTL statements correspond to the hardware logic. A "behavioral" RTL can be used to describe what a machine does (i.e., the functions it performs) without describing how the machine performs those functions, while a "structural" RTL can be used to describe a particular hardware implementation of a machine.

EDA tools typically allow circuit designers to specify circuit designs using HDLs. Such tools may, for example, accept an HDL specification of a circuit as an input and create, from the description, a hierarchical database representing the circuit design. The EDA tool may also display a graphical representation of the circuit design based on the HDL description. One example of such a tool for designing VLSI circuits is Virtuoso® Schematic Composer, available from Cadence Design Systems, Inc. of San Jose, Calif.

HDL circuit specifications may be used for testing circuits and circuit designs, as well as for fabricating the circuits themselves. For example, a software tool referred to as a "simulator" may simulate the operation of a circuit specified by an HDL circuit specification to verify that the circuit design is correct. Once verified using a simulator or other means, an HDL circuit model may be provided to a foundry to be used directly as manufacturing input for fabrication of the designed circuit.

The two most widely-used HDLs are Verilog and VHDL (Very High Speed Integrated Circuits (VHSIC) Hardware Description Language), both of which have been adopted as standards by the Institute of Electrical and Electronics Engineers (IEEE). VHDL became IEEE Standard 1076 in 1987 and Verilog became IEEE Standard 1364 in 1995. Another example of an HDL is Intel Hardware Description Language (iHDL), developed by Intel Corporation of Santa Clara, Calif.

Certain problems with conventional techniques for designing circuits using HDLs may be understood with reference to the three primary stages in the process of designing a computer processor. The first stage, as described above, is to write RTL statements describing the functions to be performed by the processor. The second stage is to design schematics of particular circuitry to perform the functions specified by the RTL statements written in the first stage. Schematics typically indicate electrical connectivity, field-effect transistor (FET) widths and lengths, and sometimes the wire widths of the circuit. Schematic design may be performed manually by human circuit designers or automatically by software. Although schematics may be generated more quickly when they are generated automatically, automatically-generated schematics tend to result in circuits that are less dense and slower than manually-generated schematics.

The third stage in microprocessor design is to draw "artwork," which specifies the circuit in yet greater detail than schematics. In particular, circuit artwork typically indicates exact FET and wire positions, widths, and lengths, and, for wires, indicates which metal layer the wire should be fabricated on. Artwork, like schematics, may be generated either manually or automatically, with similar tradeoffs between design time and performance.

One problem with this multi-stage approach to processor design is that flaws or inefficiencies in the design may not become apparent until the second or third stage in the design process. If, for example, a flaw is identified during the third stage of the design process (artwork generation), it typically is necessary to: (1) return to the first stage and modify the RTL statements in an attempt to fix the identified flaw; (2) re-generate schematics and/or artwork based on the modified RTL statements; (3) re-analyze the schematics and/or artwork, and (4) repeat steps (1)–(3) as necessary until all identified design flaws have been eliminated or sufficiently mitigated. This iterative process can be tedious and time-consuming, particularly if the RTL statements, schematics, or artwork are generated manually.

One kind of design inefficiency that may be identified based on circuit schematics or artwork is an unacceptably long signal propagation delay in the circuit. Examples of software tools that performs timing analysis of circuits based on schematics are PathMill® and PathMill® Plus, available from Synopsys, Inc. of Mountain View, Calif.

It would be useful to identify the existence of an unacceptably long delay prior to the generation of schematics so that the RTL statements which describe the circuit may be modified in an attempt to reduce the delay to an acceptable level without the need to generate and analyze schematics. Some existing systems are capable of generating delay estimates based on RTL statements. An example of such a system is PrimeTime, available from Synopsys, Inc. of Mountain View, Calif. The delay estimates generated by such systems, however, are not accurate under all circumstances. As a result, such systems may fail to detect an unacceptably long delay at the RTL-generation stage of the design process, thereby requiring the generation and analysis of schematics, or even artwork, for accurate delay estimates to be made, with the attendant disadvantages described above.

What is needed, therefore, are improved techniques for performing timing estimation in circuits specified using hardware description languages.

SUMMARY

Techniques are disclosed for estimating the signal propagation delays within a circuit, based on a description of the circuit written in a hardware description language (HDL), such as a register transfer language (RTL). Assignment statements in the description which describe the performance of a logical function are modeled using logic gates which perform the function described. A particular function may be modeled using one or more logic gates depending on the number of inputs to the function. The delay associated with performance of the function is estimated by estimating the delay through the circuit used to model the function. Estimates for multiple functions may be combined to estimate the total delay associated with a particular signal path through a circuit.

For example, in one aspect of the present invention, a method is provided which includes steps of: (A) identifying a maximum number of inputs to be provided to at least one logic gate in a circuit described by a description written in a hardware description language (such as a register transfer language); (B) identifying a number of inputs to a function described by a statement (such as an assignment statement) in the description; and (C) identifying a number of logic gates that implement the function using the equation:

$$\text{num\_gates} = \text{ceil} (\log_m \text{num\_inputs}),$$

wherein num_gates is the number of logic gates, m is the maximum number of inputs, num_inputs is the number of inputs to the function and the ceil ( ) function accepts a single argument and returns the next highest integer value after the argument. The value m may, for example, be the maximum number of inputs to be provided to each logic gate in the circuit.

The step (A) may include steps of: (1) identifying the function described by the statement; (2) identifying a class of logical functions (such as Boolean logical functions) to which the identified function belongs; and (3) selecting a value for m based on the identified class of logical functions. The step (A)(1) may include steps of: (a) identifying at least one token in the statement that represents the function, and (b) identifying the function based on the at least one token.

The method may further include a step of: (D) estimating a signal propagation delay associated with the logic gates that implement the function by multiplying the number of logic gates by a gate delay associated with the logic gates. The method may further include steps of: (E) identifying a set of statements in the description defining a path from an input of the circuit to an output of the circuit; (F) performing steps (A)-(D) for each statement in the set of statements to produce a plurality of signal propagation delay estimates; and (G) summing the plurality of signal propagation delay estimates to produce a total signal propagation delay estimate for the path from the input of the circuit to the output of the circuit.

In another aspect of the present invention, a method is provided which includes steps of: (A) identifying a maximum number of inputs to be provided to at least one logic gate in a circuit described by a description written in a hardware description language; (B) identifying a number of inputs to a function described by a statement in the description; (C) determining whether the number of inputs to the function is greater than the maximum number of inputs; (D) selecting at least one logic gate to model the function by performing steps of: (1) selecting a single logic gate for performing the function if the number of inputs to the function is determined not to be greater than the maximum number of inputs; and (2) selecting a plurality of logic gates for performing the function if the number of inputs to the function is determined to be greater than the maximum number of inputs.

The method may further include a step of: (E) estimating a signal propagation delay associated with the at least one logic gate. The step (E) may include steps of: (1) if the at least one logic gate consists of a single logic gate, identifying a signal propagation delay associated with the single logic gate; and (2) if the at least one logic gate consists of a plurality of logic gates, multiplying the number of the plurality of logic gates by a gate delay associated with each of the plurality of logic gates.

The method may further include steps of: (F) identifying a set of statements in the description defining a path from an input of the circuit to an output of the circuit; (G) performing steps (A)–(F) for each statement in the set of statements to produce a plurality of signal propagation delay estimates; and (H) summing the plurality of signal propagation delay estimates to produce a total signal propagation delay estimate for the path from the input of the circuit to the output of the circuit.

Other features and advantages of various aspects and embodiments of the present invention will become apparent from the following description and from the claims.

DETAILED DESCRIPTION

Techniques are disclosed for estimating the signal propagation delays within a circuit, based on a description of the circuit written in a hardware description language (HDL), such as a register transfer language (RTL). Assignment statements in the description which describe the performance of a logical function are modeled using logic gates which perform the function described. A particular function may be modeled using one or more logic gates depending on the number of inputs to the function. The delay associated with performance of the function is estimated by estimating the delay through the circuit used to model the function. Estimates for multiple functions may be combined to estimate the total delay associated with a particular signal path through a circuit.

Figure 1:
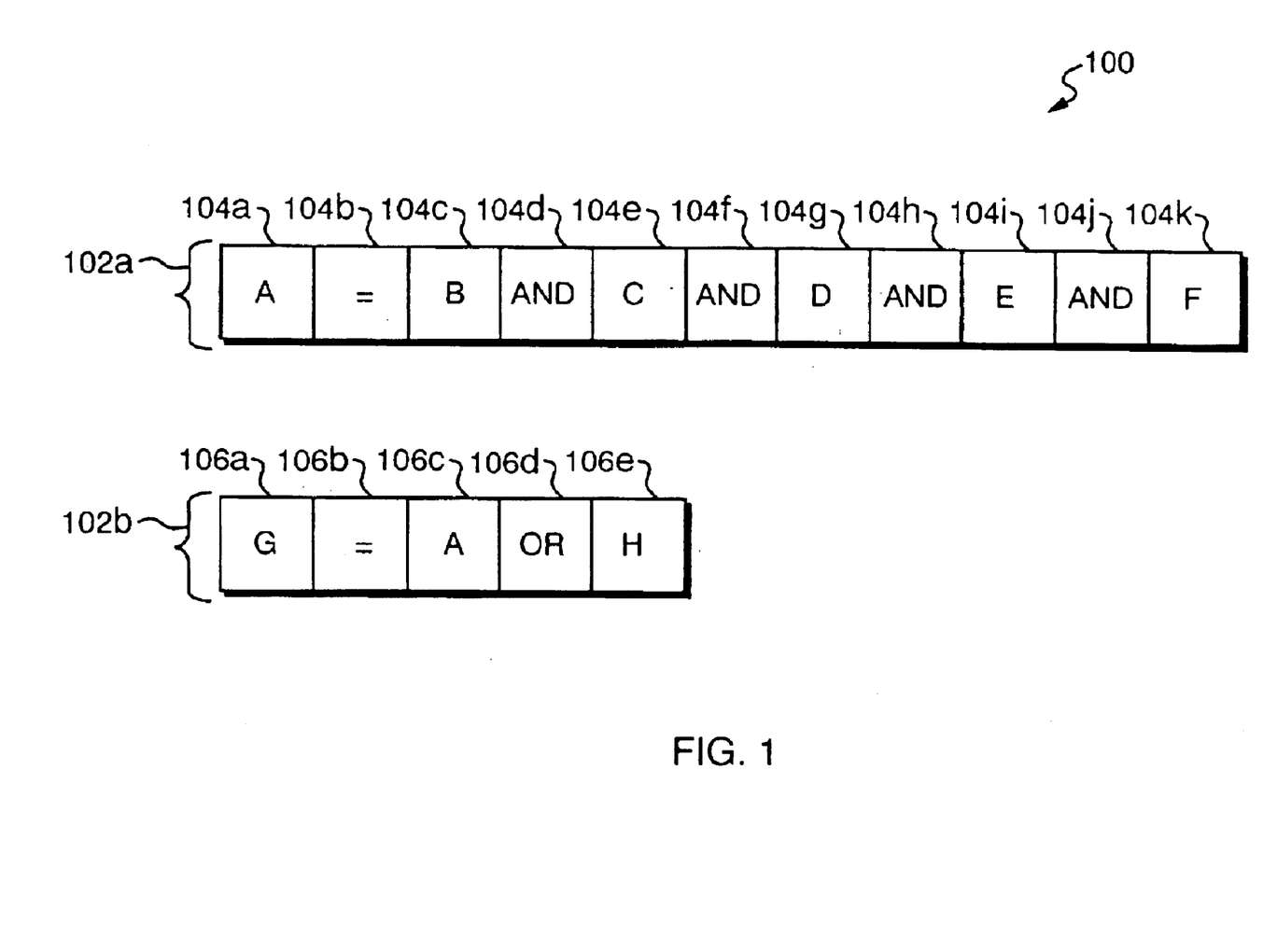
FIG. 1 is a diagram of an example description of a circuit written in a register transfer language (RTL)

Before describing particular embodiments of the present invention, an example of a prior art technique for performing timing estimation based on RTL statements will be described. Referring to FIG. 1, an example RTL circuit description 100 is shown. The RTL circuit description 100 includes two RTL statements 102a and 102b. Although the circuit description 100 includes only two statements 102a–b for ease of illustration and explanation, an RTL description that describes a microprocessor may include hundreds or thousands of RTL statements. Furthermore, although both of the RTL statements 102a–b are assignment statements, RTL descriptions may include statements other than assignment statements.

The first RTL statement 102a is an assignment statement which assigns to a variable A the result of performing a logical AND operation on variables B, C, D, E, and F. As described above, the variables A, B, C, D, E, and F represent signals, such as those that may be stored in processor registers.

The first RTL statement 102a includes a plurality of tokens 104a–k which represent the logical AND operation just described. More specifically: (1) token 104a represents the variable A which is to be assigned the result of the logical AND operation; (2) token 104b is an equals sign, indicating that the first statement 102a is an assignment statement; (3) tokens 104c, 104e, 104g, 104i, and 104k represent the operands of the logical AND statement; and (4) tokens 104d, 104f, 104h, and 104j are operators which indicate that a logical AND operation is to be performed on the operands. Those of ordinary skill in the art will understand how to write similar statements to perform other operations (such as logical OR and exclusive OR), and how to write statements to perform similar functions using different syntaxes.

Operations, such as the logical AND operation just described, may alternatively be referred to herein as "functions." Furthermore, operands may alternatively be referred to herein as "inputs" to functions.

The second RTL statement 102b is an assignment statement which assigns to a variable G the result of performing a logical OR operation on variables A and H. The second RTL statement 102b includes a plurality of tokens 106a–e which represent the logical OR operation just described. More specifically: (1) token 106a represents the variable G which is to be assigned the result of the logical OR operation; (2) token 106b is an equals sign, indicating that the second statement 102b is an assignment statement; (3) tokens 106e and 106e represent the operands of the logical OR statement; and (4) token 106d is an operator which indicates that a logical OR operation is to be performed on the operands.

Figure 2:
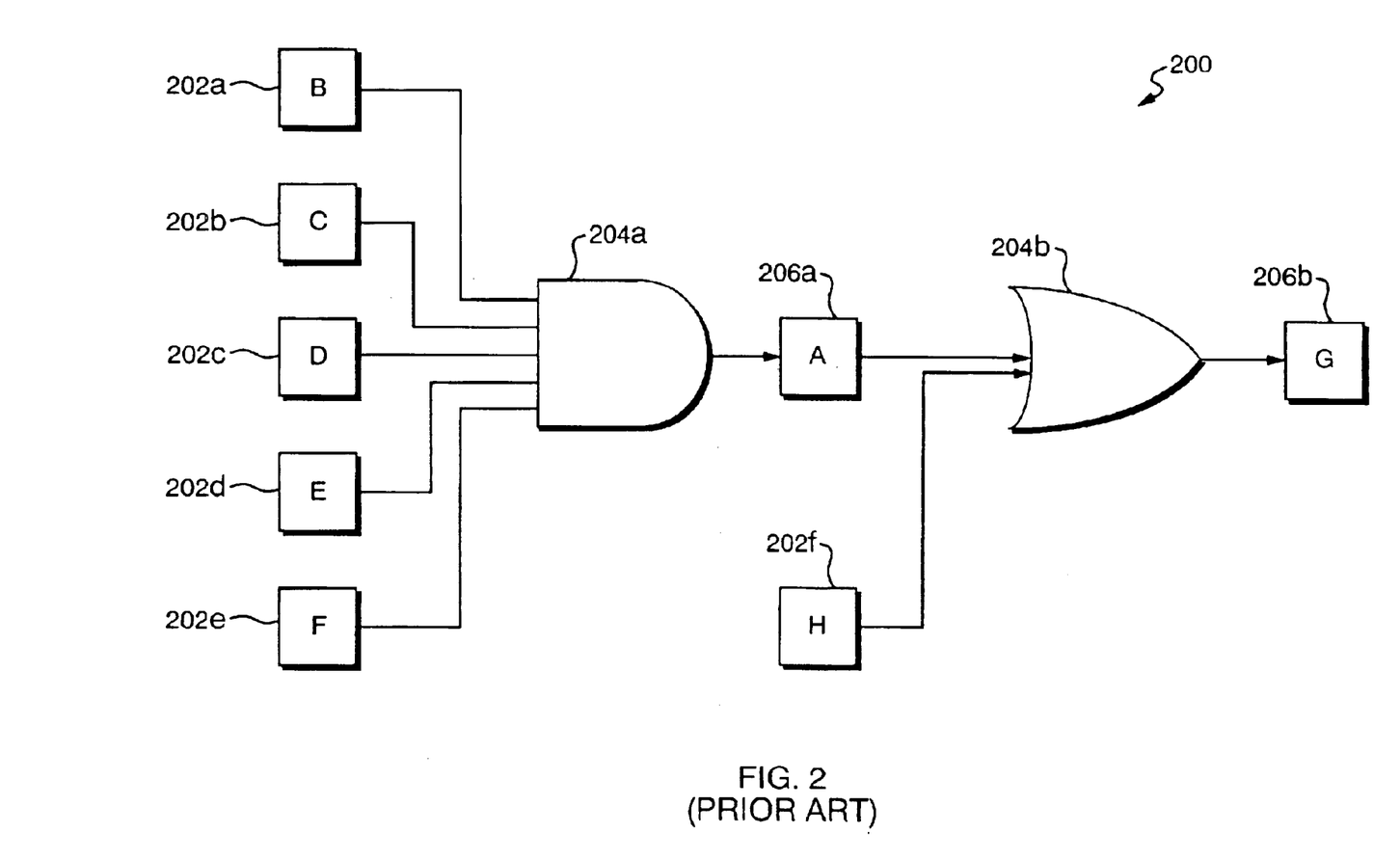
FIG. 2 is a schematic diagram of a first circuit that performs the functions described by the RTL circuit description shown in FIG. 1 and which is used in prior art systems to estimate signal propagation delays.

Now consider the problem of determining the total signal propagation delay from one of the inputs to the first statement 102a to the output of the second statement 102b. Referring to FIG. 2, a schematic diagram is shown of a circuit 200 that performs the functions described by the RTL circuit description 100 shown in FIG. 1. Some prior art systems model the RTL circuit description 100 using a circuit such as circuit 200 to estimate the signal propagation delay of signals specified by the description 100.

Circuit 200 includes inputs 202a, 202b, 202c, 202d, 202e, and 202f, corresponding to the variables B, C, D, E, F, and H represented by the tokens 104c, 104e, 104g, 104i, 104k, and 106e (FIG. 1), respectively. Circuit 200 also includes an AND gate 204a, corresponding to the AND operation represented by tokens 104d, 104f, 104h, and 104j. Note that the circuit 200 implements the AND operation specified by RTL statement 102a using the single 5-input AND gate 204a. The inputs 202a–e are provided as input to the AND gate 204a, which performs a logical AND operation on the inputs 202a–e and provides the result at intermediate output 206a, corresponding to the variable A and the token 104a.

Circuit 200 also includes a two-input OR gate 204b, corresponding to the OR operation represented by token 106d. The intermediate output 206a and input 202f (corresponding to the variable H and the token 106e) are provided as input to the OR gate 204b, which performs a logical OR operation on elements 206a and 202f and provides the result at output 206b, corresponding to the variable G and the token 106a.

Now consider, for example, the problem of estimating the delay from input B 202a to output G 206b. It can be seen from the RTL statements 102a–b shown in FIG. 1, or more easily by reference to the circuit 200 shown in FIG. 2, that the path from input B 202a to output G 206b traverses both AND gate 204a and OR gate 204b. Some existing systems therefore estimate the delay from input 202a to output 206b by identifying each logic gate (or other circuit element) in the path from input 202a to output 206b, and summing the delay through each such logic gate. In the present example, the delay from input 202a to output 206b would be estimated as the sum of the delay through AND gate 204a and OR gate 204b.

Some systems generate such an estimate by directly analyzing the RTL description 100 of the circuit. For example, some systems estimate the delay associated with a particular input-output pair by: (1) scanning the RTL description 100 for assignment statements linking the input to the output; (2) assuming that each identified assignment statement is implemented by a single logic gate; and (3) summing the delay associated with each logic gate.

For example, with respect to the RTL description 100 shown in FIG. 1, such systems would estimate the delay from input B to output G by: (1) identifying the RTL assignment statements 102a–b as the assignment statements linking input B to output G, (2) assuming that assignment statement 102a is implemented with a single AND gate (e.g., AND gate 204a) and that assignment statement 102b is implemented with a single OR gate (e.g., OR gate 204b), and (3) summing the delays associated with the AND gate 204a and OR gate 204b to generate an estimate of the total delay from input B 202a to output G 206b.

One problem with performing circuit timing estimation using the techniques just described is that, in practice, there may be limitations on the number of inputs provided to a single logic gate. As the number of inputs to a particular logic gate increases, the capacitive load on the logic gate increases, causing degradation in various electrical characteristics of the logic gate. As a result, circuit designers often impose a limit on the number of inputs provided to individual logic gates to ensure that such logic gates satisfy performance requirements.

Assume, for example, that in a particular circuit design, logic gates are limited to having a maximum of four inputs each. Referring again to FIG. 1, note that the first RTL statement 102a includes a logical AND operation with five operands (represented by tokens 104c, 104e, 104g, 104i, and 104k), which is modeled in the prior art circuit 200 by the single five-input AND gate 204a. The circuit 200, therefore, does not accurately model the manner in which the RTL statements 102a–b would be implemented in a system which imposes a 4-input limit on logic gates. A delay estimate generated by such a system may therefore be inaccurate.

In various embodiments of the present invention, individual RTL assignment statements may be modeled by one or more logic gates depending on the number of inputs provided to the function described by the statement. In one embodiment of the present invention, for example, a function having a greater number of inputs than a predetermined maximum number of inputs is modeled using a multi-stage logic gate, in which each component logic gate has no more than the maximum number of inputs. The maximum number of inputs is referred to herein as the "maximum gate fan-in."

Figure 3:
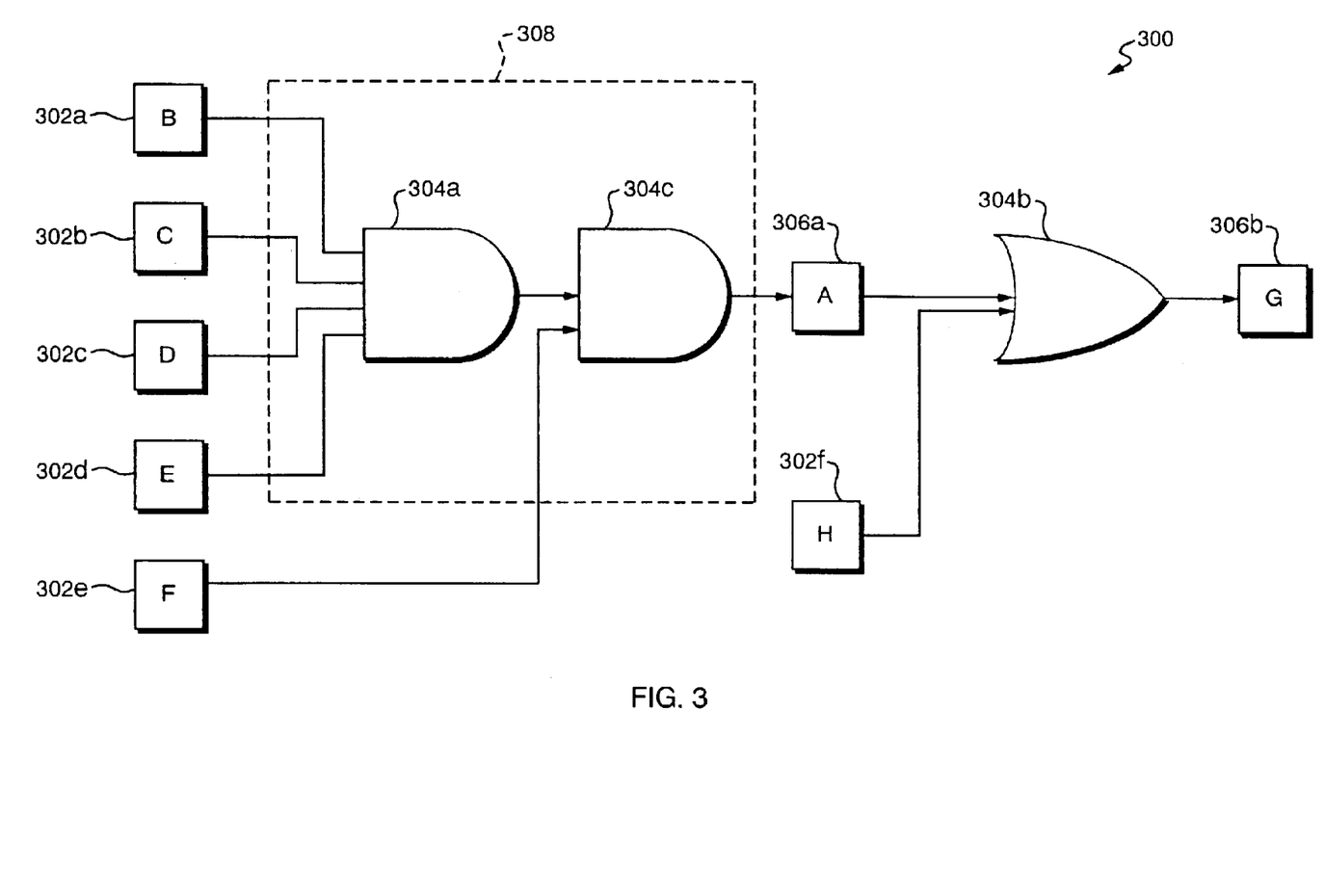
FIG. 3 is a schematic diagram of a second circuit that performs the functions described by the RTL circuit description shown in FIG. 1 and which is used in embodiments of the present invention to estimate signal propagation delays.

Referring to FIG. 3, a schematic diagram is shown of a circuit 300 that performs the functions described by the RTL circuit description 100 shown in FIG. 1. Unlike the circuit 200 shown in FIG. 2, the circuit 300 shown in FIG. 3 obeys a 4-input limit for logic gates. In particular, the circuit 300 implements the first RTL statement 102a using a two-stage AND gate 308, which includes two AND gates 304a and 304c, each of which has at most four inputs, rather than by using the single five-input AND gate 204a shown in the circuit 200 (FIG. 2).

More specifically, circuit 300 includes inputs 302a, 302b, 302c, 302d, 302e, and 302f, corresponding to the variables B, C, D, E, F, and H represented by the tokens 104c, 104e, 104g, 104i, 104k, and 106e (FIG. 1), respectively. The two-stage AND gate 308 corresponds to the AND operation represented by tokens 104d, 104f, 104h, and 104j. AND gate 304a is a four-input AND gate which receives inputs 302a, 302b, 302c, and 302d as inputs, while AND gate 304c is a two-input AND gate which receives the output of AND gate 304a and the input 302e as inputs. Those of ordinary skill in the art will appreciate that this two-stage AND gate 308 performs the function specified by the first RTL statement 102a, and that the same function may alternatively be implemented by other two-stage AND gates, or by AND gates having three or more stages. For example, the two-stage AND gate 308 may alternatively be implemented using: (1) a first AND gate receiving inputs 302a, 302b, and 302c as inputs; (2) a second AND gate receiving inputs 302d and 302e as inputs; and (3) a third AND gate receiving the outputs of the first and second AND gates as inputs.

The two-stage AND gate 308 performs a logical AND operation on its inputs and provides the result at intermediate output 306a, corresponding to the variable A and the token 104a.

Circuit 300 also includes a two-input OR gate 304b, corresponding to the OR operation represented by token 106d. The intermediate output A 306a and input H 302f are provided as input to the OR gate 304b, which performs a logical OR operation on elements 306a and 306f and provides the result at output 306b, corresponding to the variable G and the token 106a.

It may be appreciated by reference to FIG. 3 that the path from input B 302a to output G 306b includes three logic gates (304a, 304c, and 304b), in contrast to the two logic gates 204a and 204b in FIG. 2. An estimate of the delay from input B 302a to output G 306b should therefore take into account the delays associated with the three logic gates 304a, 304b, and 304c. Examples of techniques for generating such an estimate will now be described.

Let m be the maximum gate fan-in for a particular circuit design. Let num_inputs be the number of inputs to the function described by a particular RTL assignment statement. Let num_gates be the number of logic gates that are used to model the RTL assignment statement. According to one embodiment of the present invention, the number of logic gates num_gates is estimated according to Equation 1:

$$\text{num\_gates}=\text{ceil}(\log_m \text{num\_inputs}) \quad \text{Equation 1}$$

where the ceil( ) function accepts a single argument and returns the next highest integer value after the argument. For example, ceil(2.3)=3.

Consider, for example, a case in which the maximum gate fan-in m=4. In the case of the first RTL statement 102a, num_inputs=5, because the number of operands in the AND operation is equal to five. Applying Equation 1 to this example gives num_gates=ceil($\log_4$ 5)=2. In other words, the calculated number of logic gates to implement RTL statement 102a is two, based on the stated assumptions. It can be seen from FIG. 3 that this answer is correct, as illustrated by the two-stage AND gate 308, which includes two AND gates 304a and 304c.

Alternatively, if the RTL statement 102a had included only four operands, then num_inputs=4. Applying Equation 1, to this example would result in num_gates=ceil($\log_4$ 4)=1. In other words, the calculated number of logic gates would drop to one, based on the stated assumptions. It can be seen from FIG. 3 that this answer is correct, since it can be seen that an AND operation with four operands could be implemented using the single AND gate 304a, thereby eliminating the second AND gate 304c, while satisfying the 4-input limitation.

The calculation performed by Equation 1 is based on the assumption that a function having a number of inputs equal to num_inputs is to be implemented using a multi-stage logic gate in which each component logic gate has at most m inputs. Although there are many ways to implement a particular logical function using multi-stage logic gates that adhere to the maximum gate fan-in rule, no such implementation will include fewer than the number of logic gates specified by Equation 1. The results provided by Equation 1, therefore, represent a reasonable prediction of the number of logic gates that will be used to implement a particular function if individual logic gates are limited to having at most m inputs each. It should be appreciated, however, that Equation 1 is provided merely for purposes of example and that other techniques may be used to estimate the number of logic gates that will be used to perform the function described by a particular RTL statement.

Figure 4A:
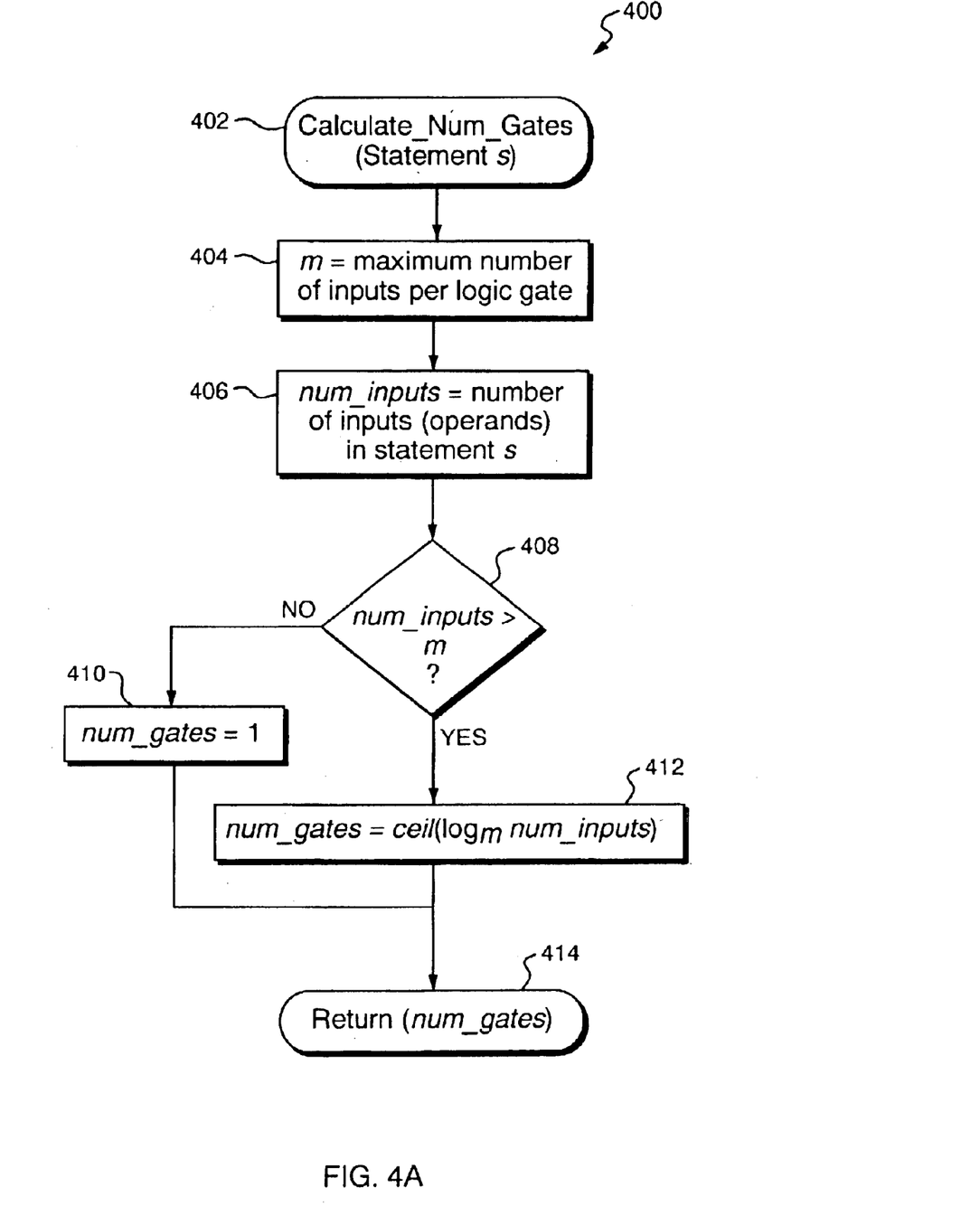
FIG. 4A is a flowchart of a method that is used in one embodiment of the present invention to estimate the number of logic gates that may be used to implement an RTL assignment statement.
Figure 4B:
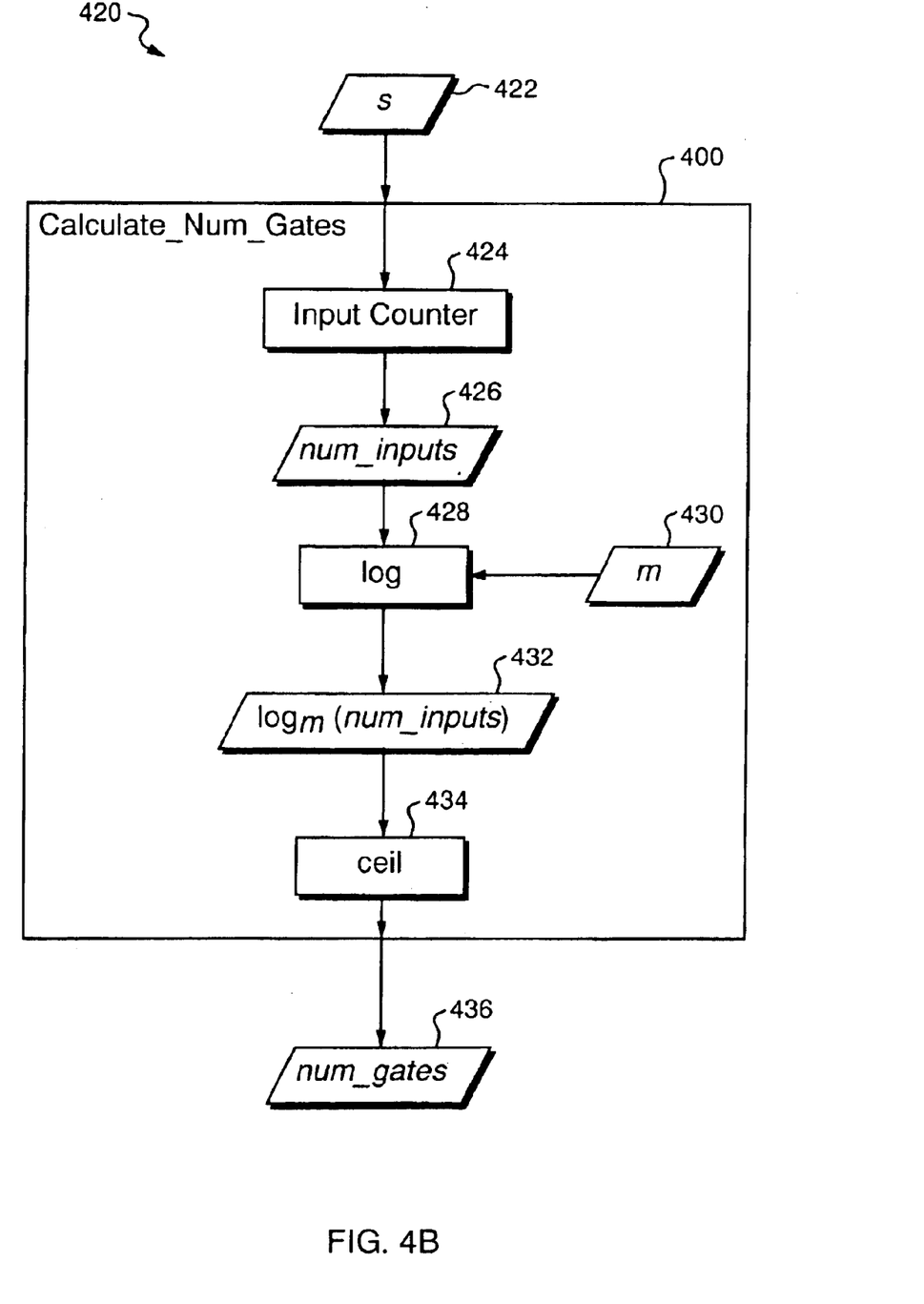
FIG. 4B is a dataflow diagram which illustrates the actions performed by the method of FIG. 4A.

More generally, referring to FIG. 4A, a flowchart is shown of a method 400 that may be used to predict the number of logic gates that will be used to implement an RTL assignment statement according to one embodiment of the present invention. Referring to FIG. 4B, a dataflow diagram 420 is shown which illustrates the actions performed by the method 400. The method 400 is implemented as a function named Calculate_Num_Gates which takes as input a single argument s 422 representing the RTL assignment statement for which the number of implementing logic gates is to be calculated (step 402).

The method 400 assigns to a variable m 430 the maximum allowed number of inputs per logic gate (step 404). The value of m may, for example, be predetermined by the circuit designer. The value of m may be the same for all logic gates in a circuit or, for example, may vary among logic gates or among different types of logic gates. For example, different values of m may be associated with AND gates and OR gates.

The method 400 assigns to a variable num_inputs 426 the number of inputs (operands) in the statement s (step 406). For example, as shown in FIG. 4B the number of inputs num_inputs 426 may be identified using an input counter 424 which parses the text of the assignment statement s 422 using techniques that are well-known to those of ordinary skill in the art. The number of inputs in RTL statement 102a (FIG. 1), for example, is five.

The method 400 determines whether the number of inputs num_inputs is greater than the maximum gate fan-in m (step 408). If num_inputs$\leq$m, then the function described by statement s may be implemented using a single logic gate having at most m inputs, and the a value of one is therefore assigned to num_gates (step 410). If num_inputs>m, then the function described by statement s may not be implemented using a single logic gate having at most m inputs, and the method 400 calculates the value of num_gates 436 using Equation 1, based on the values of m 430 and num_inputs 426 assigned in step 404 and 406, respectively (step 412).

It should be appreciated that steps 408 and 410 are optional, since Equation 1 will provide an appropriate value for num_gates whether or not num_inputs is greater than m. For example, in the embodiment shown in FIG. 4B, both num_inputs 426 and m 430 may be provided as input to a log function 428 which computes $\log_m$ num_inputs 432, which in turn is input to a ceil function 434 which produces num_gates 436 as its output. Such an implementation will provide an appropriate value for num_gates whether or not num_inputs is greater than m. The value of num_gates 436 calculated in step 412 represents an estimated minimum number of logic gates required to implement the assignment statement s 422 based on the values of m 430 and num_inputs 426. The method 400 returns the value of num_gates 436 (step 414).

Figure 5A:
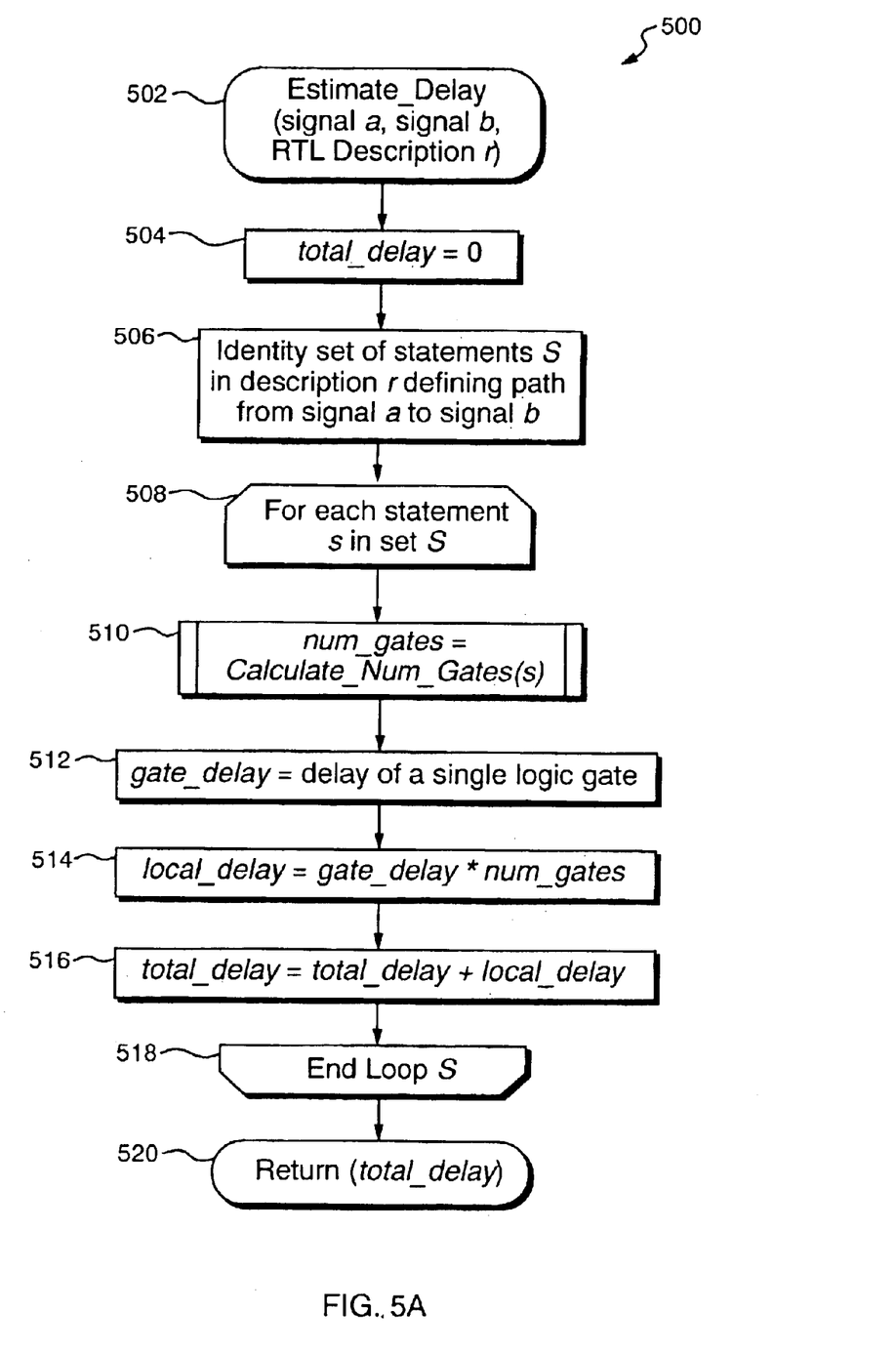
FIG. 5A is a flowchart of a method that is used in one embodiment of the present invention to estimate the total delay from a first signal to a second signal in a circuit described by an RTL description.
Figure 5B:
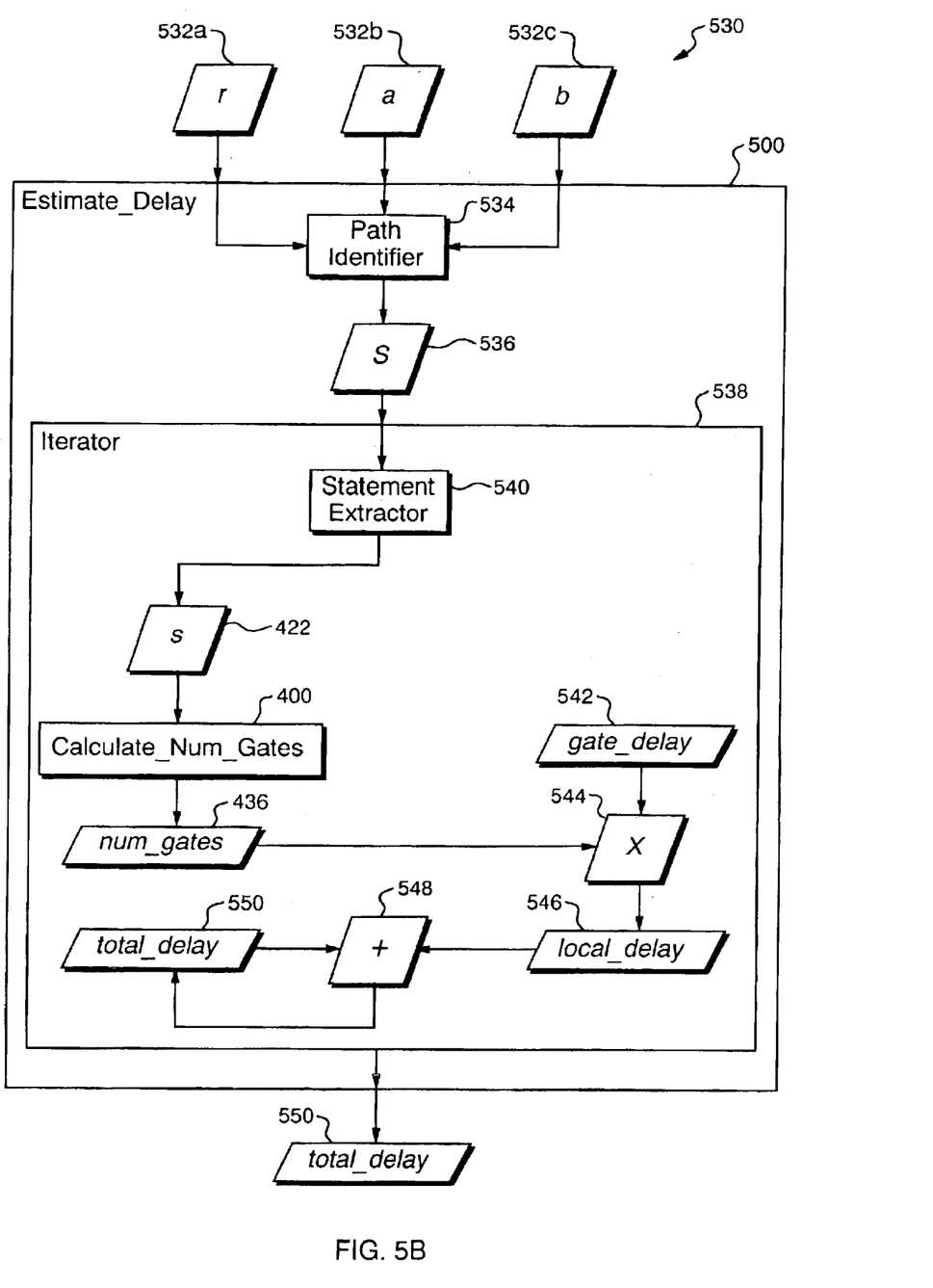
FIG. 5B is a dataflow diagram which illustrates the actions performed by the method of FIG. 5A.

Referring to FIG. 5A, a flowchart is shown of a method 500 which uses the techniques disclosed above with respect to FIG. 4A to estimate the total delay between a first signal (e.g., an input signal) and a second signal (e.g., an output signal) in a circuit described by an RTL description. Referring to FIG. 5B, a dataflow diagram 530 is shown which illustrates the actions performed by the method 500. The method 500 is implemented as a function named Estimate_Delay which takes as input the following arguments: (1) an RTL description r 532a of a circuit; (2) the first signal a 532b, representing the beginning of a signal path to be traced through the circuit; and (3) the second signal b 532c, representing the end of the signal path to be traced through the circuit (step 502). As will now be described in more detail, the method 500 estimates the delay from signal a 532b to signal b 532c based on the assumption that each assignment statement in the description r 532a is to be implemented using the number of logic gates calculated by the function Calculate_Num_Gates 400 (FIG. 4A).

The method 500 initializes a variable total_delay 550 to a value of zero (step 504). As will be described in more detail below, the variable total_delay 550 accumulates the total delay through the circuit from signal a 532b to signal b 532c.

The method 500 identifies the set of assignment statements S 536 in the description r 532a that describes the path through the circuit from signal a 532b to signal b 532c (step 506). For example, as shown in FIG. 5B, a path identifier 534 selects the set of statements S 536 in the RTL description r 532a that define the path through the circuit from signal a 532b to signal b 532c. For example, in the case of the RTL description 100 (FIG. 1), the path from input B to output G is defined by RTL statements 102a (which defines the generation of intermediate output A from input B) and 102b (which defines the generation of output G from intermediate output A). Similarly, the path from input H to output G is defined by the single RTL statement 102b. Techniques for identifying a set of RTL statements that define the path linking a first specified signal to a second specified signal are well-known to those of ordinary skill in the art.

The method 500 enters a loop over each statement s in the set S 536 (step 508). For example, as shown in FIG. 5B, an iterator 538 iterates over each statement in the set of statements S 536. The iterator 538 includes a statement extractor 540 which sequentially extracts each statement s 422 from the set S 536.

For each statement s 422, the method 500 calculates the minimum number of logic gates required to implement statement s 422 using the function Calculate_Num_Gates 400, and assigns the result to the variable num gates 436 (step 510).

The method 500 identifies the delay of a single logic gate and assigns the identified delay to a variable gate_delay 542 (step 512). The value assigned in step 512 may be identified in any of a variety of ways. For example, the gate delay assigned in step 512 may be a constant that represents an estimate of the average gate delay of logic gates (such as AND gates, OR gates, and XOR gates) that may be used in the circuit described by the description r 532a. Alternatively, for example, a distinct gate delay may be associated with each kind of logic gate, and the value assigned to gate_delay 542 in step 512 may be the gate delay associated with the kind of logic gate required to implement statement s 422. If, for example, statement s 422 includes a logical AND operation, the value assigned to gate_delay 542 in step 512 may be the delay associated with AND gates. These particular techniques for selecting values to assign to gate_delay 542 are provided merely for purposes of example and do not constitute limitations of the present invention.

It should further be appreciated that if the statement s 422 includes multiple logical operators, such as an AND operator and an OR operator, the value assigned to gate_delay 542 may be the value associated with the operator that operates on the signal a 532b or a signal derived from the signal a 532b. If, for example, the statement s 422 is the statement "A=B AND C OR D" and the signal a 532b is input B, the value assigned to gate_delay 542 may be the gate delay associated with an AND gate because the input B is operated upon by the AND operator in this statement.

Returning to FIG. 5A, the value of gate_delay 542 is multiplied by the value of num_gates 436 (e.g., by multiplier 544) to produce an estimate of the delay associated with circuitry that implements statement s 422 (or that portion of statement s 422 which operates on signal a 532b), and the resulting estimate is assigned to a variable local_delay 546 (step 514). For example, assume that: (1) statement s 422 is the statement 102a (FIG. 1); (2) statement 102a is implemented using the two-stage AND gate 308 shown in FIG. 3, so that num_gates=2; and (3) the gate delay for each of the AND gates 304a and 304c is x ps. In such a case, the value of local_delay 546 would be equal to 2x ps, representing an estimate of the total delay of a signal through the two-stage AND gate 308.

The value of total_delay 550 is updated by increasing it by the value of local_delay 546 (e.g., using an adder 548) (step 516). Steps 510–516 are repeated for the remaining statements in set S 536 (step 518). The method 500 thereby traces a path through a hypothetical circuit from the signal a 532b to the signal b 532c, and accumulates a total delay along the traced path, based on the assumption that each assignment statement is implemented using the number of logic gates calculated by the function Calculate_Num_Gates 400.

For example, in the case of the RTL description 100 (FIG. 1) and the example implementing circuit 300 (FIG. 3), the method 500 may effectively trace the path of input B 302a through both AND gate 308 and OR gate 304b, calculating the delay of the input signal through each of the gates 308 and 304b, and summing the calculated delays to produce a final value for total_delay 550.

Upon termination of the loop performed in steps 508–518, the value of total_delay 550 represents an estimate of the total delay from signal a 532b to signal b 532c in the circuit described by description r 532a. The method 500 returns the value of total_delay 550 (step 520). The value of total_delay 550 may then be analyzed to determine, for example, whether the delay represented thereby is unacceptably long. If the value of total_delay 550 is determined to represent a delay that is unacceptably long, the RTL description 100 may be modified in an attempt to improve the efficiency of the circuit, without the need to generate and perform a timing analysis on schematics or artwork of the circuit.

Although the method 500 calculates the total delay associated with a single signal path, the method 500 may be performed on multiple signal paths in a single circuit. For example, the method 500 may be performed on each signal path in a circuit to predict whether any such signal path will result in an unacceptable delay when the circuit is implemented.

Among the advantages of the invention are one or more of the following.

The techniques disclosed herein allow analysis of a circuit to be performed based on an RTL description of the circuit, thereby avoiding the need to generate and analyze circuit schematics or artwork. The ability to generate timing estimates based on an RTL description is advantageous not only because such estimates may be generated more quickly and easily than estimates based on schematic or artwork timing analysis, but also because the need is eliminated to generate schematics or artwork in order to generate timing estimates. As a result, modifying the circuit design in an attempt to improve timing requires only repeated modification of RTL statements, not repeated modification of RTL statements and repeated generation and analysis of schematics and artwork. The ability to perform timing analysis and modify circuit designs more quickly may shorten development time, a feature which is critical in the context of microprocessor design and the design of other microelectronic products for which the development process operates under significant time constraints.

Another advantage of the techniques disclosed herein is that they may produce more accurate timing estimates than previous techniques by calculating signal path delays based on more realistic assumptions about the circuitry that will be used to implement particular RTL assignment statements. In particular, the techniques disclosed herein estimate signal path delays based on realistic assumptions about the number of logic gates that may be used to implement particular RTL assignment statements, such as the assumption that an assignment statement may be implemented using more than one logic gate, particularly if the number of operands in the assignment statement is greater than a predetermined maximum number of inputs per logic gate.

It is advantageous to estimate signal path delays in this way because doing so results in estimates that are more likely to be accurate, and which therefore are more likely to result in the generation of schematics and artwork which satisfy design requirements. As a result, generating more accurate delay estimates may increase the likelihood that timing problems will be detected prior to the generation of schematics and artwork, thereby avoiding the need to re-generate and re-analyze schematics and artwork, with all of the attendant problems described above.

It is to be understood that although the invention has been described above in terms of particular embodiments, the foregoing embodiments are provided as illustrative only, and do not limit or define the scope of the invention. Various other embodiments, including but not limited to the following, are also within the scope of the claims.

The techniques disclosed herein are not limited to use in conjunction with any particular Hardware Description Language (HDL) or Register Transfer Language (RTL). In particular, although Verilog, VHDL, and iHDL are mentioned above as examples of HDLs, the present invention is not limited to use in conjunction with these particular HDLs. Furthermore, although various embodiments of the present invention are described in conjunction with circuit descriptions written in RTLs, the present invention may also be used in conjunction with HDLs that are not RTLs.

Although in certain examples described above the maximum gate fan-in m is equal to four, this is not a limitation of the present invention. Rather, embodiments of the present invention may be used in conjunction with any maximum gate fan-in. Furthermore, there need not be a single maximum gate fan-in associated with a particular circuit. Alternatively, for example, a distinct maximum gate fan-in may be associated with each kind of logic gate (e.g., AND, OR, and XOR). The maximum gate fan-in may be selected based on empirical testing or in any other manner.

Although in certain examples above a timing path is traced from the input of a circuit to the output of a circuit, this is not a limitation of the present invention. Rather, the techniques disclosed herein may be applied more generally to any timing path that originates and/or terminates within a circuit.

The techniques described above may be implemented, for example, in hardware, software, firmware, or any combination thereof. The techniques described above, such as those described above with respect to FIGS. 4A–4B and FIGS. 5A–5B, may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language such as C, or an object-oriented programming language such as C++ or Java. The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

What is claimed is:

1. A method comprising steps of:
   (A) identifying a maximum number of inputs to be provided to at least one logic gate in a circuit described by a description written in a hardware description language;
   (B) identifying a number of inputs to a function described by a statement in the description; and
   (C) identifying a number of logic gates that implement the function using the equation:

$$\text{num\_gates} = \text{ceil}(\log_m \text{num\_inputs}),$$

wherein num_gates is the number of logic gates, m is the maximum number of inputs, num_inputs is the number of inputs to the function and the ceil ( ) function accepts a single argument and returns the next highest integer value after the argument.

2. The method of claim 1, wherein m is the maximum number of inputs to be provided to each logic gate in the circuit.

3. The method of claim 1, wherein the step (A) comprises steps of:
   (A)(1) identifying the function described by the statement;
   (A)(2) identifying a class of logical functions to which the identified function belongs; and
   (A)(3) selecting a value for m based on the identified class of logical functions.

4. The method of claim 3, wherein the step (A)(1) comprises steps of: (a) identifying at least one token in the statement that represents the function, and (b) identifying the function based on the at least one token.

5. The method of claim 3, wherein the class of logical functions comprises a class of Boolean logical functions.

6. The method of claim 1, wherein the hardware description language comprises a register transfer language.

7. The method of claim 1, wherein the statement comprises an assignment statement.

8. The method of claim 1, further comprising a step of:
   (D) estimating a signal propagation delay associated with the logic gates that implement the function by multiplying the number of logic gates by a gate delay associated with the logic gates.

9. The method of claim 8, further comprising steps of:
   (E) identifying a set of statements in the description defining a path from an input of the circuit to an output of the circuit;
   (F) performing steps (A)–(D) for each statement in the set of statements to produce a plurality of signal propagation delay estimates; and
   (G) summing the plurality of signal propagation delay estimates to produce a total signal propagation delay estimate for the path from the input of the circuit to the output of the circuit.

10. A device comprising:
    first identification means for identifying a maximum number of inputs to be provided to at least one logic gate in a circuit described by a description written in a hardware description language;
    second identification means for identifying a number of inputs to a function described by a statement in the description; and
    third identification means for identifying a number of logic gates that implement the function using the equation:

$$\text{num\_gates} = \text{ceil}(\log_m \text{num\_inputs}),$$

wherein num_gates is the number of logic gates, m is the maximum number of inputs, num_inputs is the number of inputs to the function and the ceil ( ) function accepts a single argument and returns the next highest integer value after the argument.

11. The device of claim 10, wherein m is the maximum number of inputs to be provided to each logic gate in the circuit.

12. The device of claim 10, wherein the first identification means comprises:
    fourth identification means for identifying the function described by the statement;
    fifth identification means for identifying a class of logical functions to which the identified function belongs; and
    means for selecting a value for m based on the identified class of logical functions.

13. The device of claim 12, wherein the fourth identification means comprises sixth identification means for identifying at least one token in the statement that represents the function, and seventh identification means for identifying the function based on the at least one token.

14. The device of claim 12, wherein the class of logical functions comprises a class of Boolean logical functions.

15. The device of claim 10, wherein the hardware description language comprises a register transfer language.

16. The device of claim 10, wherein the statement comprises an assignment statement.

17. The device of claim 10, further comprising:
    estimation means for estimating a signal propagation delay of the logic gates that implement the function by multiplying the number of logic gates by a gate delay associated with the logic gates.

18. The device of claim 17, further comprising:
    fourth identification means for identifying a set of statements in the description defining a path from an input of the circuit to an output of the circuit;
    means for activating the first identification means, the second identification means, the third identification means, arid the estimation means for each statement in the set of statements to produce a plurality of signal propagation delay estimates; and means for summing the plurality of signal propagation delay estimates to produce a total signal propagation delay estimate for the path from the input of the circuit to the output of the circuit.

19. A method comprising steps of:
(A) identifying a maximum number of inputs to be provided to at least one logic gate in a circuit described by a description written in a hardware description language;
(B) identifying a number of inputs to a function described by a statement in the description;
(C) determining whether the number of inputs to the function is greater than the maximum number of inputs;
(D) selecting at least one logic gate to model the function by performing steps of:
 (1) selecting a single logic gate for performing the function if the number of inputs to the function is determined not to be greater than the maximum number of inputs; and
 (2) selecting a plurality of logic gates for performing the function if the number of inputs to the function is determined to be greater than the maximum number of inputs.

20. The method of claim 19, further comprising a step of:
(E) estimating a signal propagation delay associated with the at least one logic gate.

21. The method of claim 20, wherein the step (E) comprises steps of:
(3) if the at least one logic gate consists of a single logic gate, identifying a signal propagation delay associated with the single logic gate; and
(4) if the at least one logic gate consists of a plurality of logic gates, multiplying the number of the plurality of logic gates by a gate delay associated with each of the plurality of logic gates.

22. The method of claim 21, further comprising steps of:
(F) identifying a set of statements in the description defining a path from an input of the circuit to an output of the circuit;
(G) performing steps (A)–(F) for each statement in the set of statements to produce a plurality of signal propagation delay estimates; and
(H) summing the plurality of signal propagation delay estimates to produce a total signal propagation delay estimate for the path from the input of the circuit to the output of the circuit.

23. The method of claim 19, wherein the step (D)(2) comprises a step of selecting a plurality of logic gates whose number if specified by the equation:

$$\text{num\_gates} = \text{ceil}(\log_m \text{num\_inputs}),$$

wherein num_gates is the number of logic gates, m is the maximum number of inputs, num_inputs is the number of inputs to the function and the ceil ( ) function accepts a single argument and returns the next highest integer value after the argument.

24. The method of claim 23, wherein the step (D)(2) comprises a step of selecting a multi-stage logic gate including a number of logic gates equal to num_gates.

25. The method of claim 19, wherein the maximum number of inputs is the maximum number of inputs to be provided to each logic gate in the circuit.

26. The method of claim 19, wherein the step (A) comprises steps of:
(A)(1) identifying the function described by the statement;
(A)(2) identifying a class of logical functions to which the identified function belongs; and
(A)(3) selecting a value for m based on the identified class of logical functions.

27. The method of claim 26, wherein the step (A)(1) comprises steps of: (a) identifying at least one token in the statement that represents the function, and (b) identifying the function based on the at least one token.

28. The method of claim 27, wherein the class of logical functions comprises a class of Boolean logical functions.

29. The method of claim 19, wherein the hardware description language comprises a register transfer language.

30. The method of claim 19, wherein the statement comprises an assignment statement.

31. A device comprising:
first identification means for identifying a maximum number of inputs to be provided to at least one logic gate in a circuit described by a description written in a hardware description language;
second identification means for identifying a number of inputs to a function described by a statement in the description;
determination means for determining whether the number of inputs to the function is greater than the maximum number of inputs;
first selection means for selecting at least one logic gate to model the function, the means for selecting comprising:
 second selection means for selecting a single logic gate for performing the function if the number of inputs to the function is determined not to be greater than the maximum number of inputs; and
 third selection means for selecting a plurality of logic gates for performing the function if the number of inputs to the function is determined to be greater than the maximum number of inputs.

32. The device of claim 31, further comprising:
estimation means for estimating a signal propagation delay of the at least one logic gate.

33. The device of claim 32, wherein the means for estimating comprises:
means for identifying the signal propagation delay of the single logic gate if the at least one logic gate consists of the single logic gate; and
means for multiplying the number of the plurality of logic gates by a gate delay associated with each of the plurality of logic gates if the at least one logic gate consists of the plurality of logic gates.

34. The device of claim 33, further comprising:
third identification means for identifying a set of statements in the description defining a path from an input of the circuit to an output of the circuit;
means for activating the first identification means, the second identification means, the determination means, the selection means, the estimation means, and the third identification means for each statement in the set of statements to produce a plurality of signal propagation delay estimates; and
means for summing the plurality of signal propagation delay estimates to produce a total signal propagation delay estimate for the path from the input of the circuit to the output of the circuit.

35. The device of claim 31, wherein the third selection means comprises means for selecting a plurality of logic gates whose number if specified by the equation;

$$\text{num\_gates} = \text{ceil}(\log_m \text{num\_inputs}),$$

wherein num_gates is the number of logic gates, m is the maximum number of inputs, num_inputs is the number of inputs to the function and the ceil ( ) function accepts a single argument and returns the next highest integer value after the argument.

36. The device of claim 35, wherein the third selection means comprises means for selecting a multi-stage logic gate including a number of logic gates equal to num_gates.

37. The device of claim 31, wherein the maximum number of inputs is the maximum number of inputs to be provided to each logic gate in the circuit.

38. The device of claim 31, wherein the first identification means comprises:

third identification means for identifying the function described by the statement;

fourth identification means for identifying a class of logical functions to which the identified function belongs; and means for selecting a value for m based on the identified class of logical functions.

39. The device of claim 38, wherein the step third identification means comprises: (a) means for identifying at least one token in the statement that represents the function, and (b) means for identifying the function based on the at least one token.

40. The device of claim 39, wherein the class of logical functions comprises a class of Boolean logical functions.

41. The device of claim 31, wherein the hardware description language comprises a register transfer language.

42. The device of claim 31, wherein the statement comprises an assignment statement.

* * * * *

UNITED STATES PATENT AND TRADEMARK OFFICE
CERTIFICATE OF CORRECTION

PATENT NO. : 6,904,573 B1
APPLICATION NO. : 10/446097
DATED : June 7, 2005
INVENTOR(S) : David Burden Page 1 of 1

It is certified that error appears in the above-identified patent and that said Letters Patent is hereby corrected as shown below:

In column 13, line 41, in Claim 1, after "function" insert -- , --.

In column 14, line 31, in Claim 10, after "function" insert -- , --.

In column 15, line 1, in Claim 18, after "means," delete "arid" and insert -- and --, therefor.

In column 15, line 59, in Claim 23, after "function" insert -- , --.

In column 17, line 3, in Claim 35, after "equation" delete ";" and insert -- : --, therefor.

In column 17, line 9, in Claim 35, after "function" insert -- , --.

Signed and Sealed this

Twenty-fifth Day of August, 2009

David J. Kappos
*Director of the United States Patent and Trademark Office*